(12) United States Patent
Dong et al.

(10) Patent No.: US 11,552,630 B2
(45) Date of Patent: Jan. 10, 2023

(54) COMMON-MODE TRANSIENT IMMUNITY CIRCUIT AND MODULATION-DEMODULATION CIRCUIT

(71) Applicant: Trex Technologies, Guangdong (CN)

(72) Inventors: Xin Dong, Guangdong (CN); Min Jennifer Fang, Guangdong (CN); Jun Pan, Guangdong (CN)

(73) Assignee: TREX TECHNOLOGIES, Guangdong (CN)

( * ) Notice: Subject to any disclaimer, the term of this patent is extended or adjusted under 35 U.S.C. 154(b) by 0 days.

(21) Appl. No.: 17/720,888

(22) Filed: Apr. 14, 2022

(65) Prior Publication Data
US 2022/0345127 A1  Oct. 27, 2022

(30) Foreign Application Priority Data
Apr. 22, 2021  (CN) .......................... 202110436672.7

(51) Int. Cl.
*H03K 17/16* (2006.01)
*H03K 19/20* (2006.01)

(52) U.S. Cl.
CPC ............. *H03K 17/16* (2013.01); *H03K 19/20* (2013.01)

(58) Field of Classification Search
CPC ............................... H03K 17/16; H03K 19/20
USPC ....................................................... 327/143
See application file for complete search history.

(56) References Cited

U.S. PATENT DOCUMENTS

| | | | | |
|---|---|---|---|---|
| 4,897,872 A * | 1/1990 | Siligoni | ............... | H04M 19/001 379/412 |
| 6,774,722 B2 * | 8/2004 | Hogervorst | ............. | H03F 1/086 330/258 |
| 6,998,917 B2 * | 2/2006 | Kudo | .................. | H03F 3/45192 330/258 |

(Continued)

FOREIGN PATENT DOCUMENTS

| | | |
|---|---|---|
| CN | 104200260 A | 12/2014 |
| CN | 105991035 A | 10/2016 |

(Continued)

*Primary Examiner* — Ryan Jager
(74) *Attorney, Agent, or Firm* — Muncy, Geissler, Olds & Lowe, P.C.

(57) ABSTRACT

Common-mode transient immunity circuit and modulation-demodulation circuit, common-mode transient immunity circuit is applied to connecting with modulation circuit or demodulation circuit, comprising first isolation circuit, common-mode bias circuit, reference circuit and comparison circuit. Common-mode bias circuit provides common-mode bias voltage for first isolation circuit; first isolation circuit transmits common-mode bias voltage to comparison circuit; reference circuit provides reference voltage for comparison circuit; comparison circuit compares common-mode bias voltage with reference voltage, when common-mode bias voltage is larger than reference voltage, comparison circuit outputs enable signal to modulation circuit or demodulation circuit, and modulation circuit is driven to stop outputting modulation signal or demodulation circuit is driven to stop receiving modulation signal. According to invention, when common-mode transient occurs, enable signal is output to drive modulation circuit or demodulation circuit to stop working, so that influence of common-mode transient on output signal is avoided.

10 Claims, 4 Drawing Sheets

(56) References Cited

U.S. PATENT DOCUMENTS

| | | | | |
|---|---|---|---|---|
| 7,126,425 | B2* | 10/2006 | Kimura | H03F 3/45941 |
| | | | | 330/258 |
| 7,330,075 | B2* | 2/2008 | Chiang | H03F 3/45 |
| | | | | 330/290 |
| 7,532,045 | B1* | 5/2009 | Mulders | H03F 3/45632 |
| | | | | 327/552 |
| 7,564,306 | B2* | 7/2009 | Lee | H03F 3/45946 |
| | | | | 330/258 |
| 7,856,879 | B2* | 12/2010 | Cai | G01P 15/008 |
| | | | | 73/514.05 |
| 8,558,609 | B2* | 10/2013 | Fang | H03F 99/00 |
| | | | | 330/10 |
| 10,078,134 | B2* | 9/2018 | Patukuri | G01S 7/4865 |
| 10,090,815 | B2* | 10/2018 | Kumar | H03F 1/0205 |
| 10,651,811 | B2* | 5/2020 | Garrity | H03F 3/005 |
| 2020/0145263 | A1* | 5/2020 | Gotz | H04B 3/487 |
| 2021/0013834 | A1* | 1/2021 | Wang | H03F 3/45654 |

FOREIGN PATENT DOCUMENTS

| | | |
|---|---|---|
| CN | 207369033 U | 5/2018 |
| CN | 109995356 A | 7/2019 |
| CN | 112311344 A | 2/2021 |

* cited by examiner

COMMON-MODE TRANSIENT IMMUNITY CIRCUIT AND MODULATION-DEMODULATION CIRCUIT

CROSS-REFERENCE TO RELATED APPLICATIONS

This application claims priority to Chinese Patent Application No. 202110436672.7, filed on Apr. 22, 2021. The content of all of which is incorporate herein by reference.

FIELD OF THE INVENTION

The present application relates to the technical field of electronic circuit, in particular to a common-mode transient immunity circuit and a modulation-demodulation circuit.

BACKGROUND

An Isolated gate driver has been widely applied in a plurality of different applications to driving an insulated gate bipolar transistor (IGBT) and a metal-oxide-semiconductor field-effect transistor (MOSFET), including a motor driver, a solar inverter, an automobile, and more. In the prior art, any one parasitic capacitance on an isolated gate may become a coupling path for common-mode transients. Therefore, a common-mode transient immunity (CMTI) is an important parameter that shall be considered for a gate driver.

The common-mode transient immunity (CMTI) of the isolated gate driver defines an ability to inhibit the common-mode transients between an input and an output. For a gate driver adopting a capacitive isolation technology, when there is an influence of the CMTI, a relatively large transient voltage difference will exist between a ground of a transmitting circuit and a ground of a receiving circuit, and the voltage difference is able to charge and discharge an isolation capacitor, as well as being able to cause a demodulation circuit to mistake a wrong sample, and cause a false output.

Therefore, the current technology still has a plurality of defects, and needs to be improved and developed.

BRIEF SUMMARY OF THE DISCLOSURE

According to the defects in the prior art described above, the present application provides a common-mode transient immunity circuit and a modulation-demodulation circuit, to output an enable signal when common-mode transients occur, so as to drive the modulation circuit or the demodulation circuit to stop working, and avoid an influence of the common-mode transients on an output signal.

The technical solution of the present application to solve the technical problems is as follows:

The present invention provides a common-mode transient immunity circuit, applied to connecting with a modulation circuit or a demodulation circuit, comprising a first isolation circuit, a common-mode bias circuit, a reference circuit and a comparison circuit; the common-mode bias circuit provides a common-mode bias voltage for the first isolation circuit; the first isolation circuit transmits the common-mode bias voltage to the comparison circuit; the reference circuit provides a reference voltage for the comparison circuit; the comparison circuit compares the common-mode bias voltage with the reference voltage, and when the common-mode bias voltage is greater than the reference voltage, the comparison circuit outputs an enable signal to the modulation circuit or the demodulation circuit, to drive the modulation circuit to stop outputting a modulation signal or drive the demodulation circuit to stop receiving the modulation signal.

The first isolation circuit comprises a first isolation capacitor, connecting with the common-mode bias circuit and the comparison circuit, applied to transmitting a first common-mode bias voltage output by the common-mode bias circuit to the comparison circuit when common-mode transients occur.

The comparison circuit comprises a first comparison unit, connecting with the first isolation circuit and the modulation circuit or the demodulation circuit, applied to comparing the first common-mode bias voltage with the reference voltage.

The first comparison unit comprises a first comparator, a second comparator and a first NAND gate, a positive input end of the first comparator is fed with a first reference voltage output from the reference circuit; both an inverting input end of the first comparator and a positive input end of the second comparator are fed with the common-mode bias voltage; an inverting input end of the second comparator is fed with a second reference voltage output by the reference circuit; an output end of the first comparator and an output end of the second comparator connect respectively with a first input end and a second input end of the first NAND gate; an output end of the first NAND gate connects to a modulation circuit or a demodulation circuit.

The first isolation circuit comprises:
a first isolation capacitor connecting with the common-mode bias circuit and the comparison circuit and applied to transmitting a first common-mode bias voltage output by the common-mode bias circuit to the comparison circuit when the common-mode transients occur; and
a second isolation capacitor connecting with the common-mode bias circuit and the comparison circuit and applied to transmitting a second common-mode bias voltage output by the common-mode bias circuit to the comparison circuit when the common-mode transients occur;

The comparison circuit comprises:
a first comparison unit, connects with the first isolation capacitor and the modulation circuit or the demodulation circuit, and applied to comparing the first common-mode bias voltage with the reference voltage;
a second comparison unit, connects with the second isolation capacitor and the modulation circuit or the demodulation circuit, and applied to comparing the second common-mode bias voltage with the reference voltage; and
a first NOR gate, a first input end of the first NOR gate connects with the first comparison unit, a second input end of the first NOR gate connects with the second comparison unit, and an output end of the first NOR gate connects with the modulation circuit or the demodulation circuit.

The first comparison unit comprises a first comparator, a second comparator and a first NAND gate, a positive input end of the first comparator is fed with a first reference voltage output from the reference circuit; both an inverting input end of the first comparator and a positive input end of the second comparator are fed with the common-mode bias voltage; an inverting input end of the second comparator is fed with a second reference voltage output by the reference circuit; an output end of the first comparator and an output end of the second comparator connect respectively with a first input end and a second input end of the first NAND gate; an output end of the first NAND gate connects to a first input end of a first NOR gate;

the second comparison unit comprises a third comparator, a fourth comparator, and a second NAND gate, a positive input end of the third comparator is fed with a third reference voltage output from the reference circuit; an inverting input end of the fourth comparator is fed with a fourth reference voltage output from the reference circuit; both an inverting input end of the third comparator and a positive input end of the fourth comparator are fed with the common-mode bias voltage; an output end of the third comparator and an output end of the fourth comparator connect respectively with the first input end and the second input end of the second NAND gate; an output end of the second NAND gate connects to a second input end of a first NOR gate;

an output end of the first NOR gate connects with the modulation circuit or the demodulation circuit.

The common-mode transient immunity circuit further comprises a signal reconstruction circuit. The signal reconstruction circuit stores the input signal when common-mode transients occur and suspends transmitting the input signal to the modulation circuit, and re-detects the input signal when the common-mode transients are eliminated, if the input signal has no change, then enables the modulation circuit to continue to transmit the input signal or retransmits an original input signal, and if the input signal is changed comparing with the input signal before the common-mode transients are sent, then enables the modulation circuit to transmit a new input signal.

A modulation and demodulation circuit, comprising:

two common-mode transient immunity circuits described above, being respectively a first common-mode transient immunity circuit and a second common-mode transient immunity circuit; and a modulation circuit, connecting with the first common-mode transient immunity circuit, and applied to stopping outputting a modulation signal when receiving a first enable signal output by the first common-mode transient immunity circuit; and a demodulation circuit, connecting with the second common-mode transient immunity circuit, and applied to stopping receiving the modulation signal when receiving a second enable signal output by the second common-mode transient immunity circuit.

The modulation circuit comprises a bias circuit and a logic circuit, wherein the bias circuit and the logic circuit stop working after receiving the first enable signal; the signal reconstruction circuit suspends transmitting the input signal to the logic circuit after receiving the first enable signal, and after the first enable signal disappears, the signal reconstruction circuit detects an input state and resends the input signal.

Compared with the prior art, the present invention provides a common-mode transient immunity circuit, applied to connecting with a modulation circuit or a demodulation circuit, comprising a first isolation circuit, a common-mode bias circuit, a reference circuit and a comparison circuit; the common-mode bias circuit provides a common-mode bias voltage for the first isolation circuit; the first isolation circuit transmits the common-mode bias voltage to the comparison circuit; the reference circuit provides a reference voltage for the comparison circuit; the comparison circuit compares the common-mode bias voltage with the reference voltage, and when the common-mode bias voltage is greater than the reference voltage, the comparison circuit outputs an enable signal to the modulation circuit or the demodulation circuit, to drive the modulation circuit to stop outputting a modulation signal or drive the demodulation circuit to stop receiving the modulation signal. By outputting the enable signal when the common-mode transients occur, and driving the modulation circuit or the demodulation circuit to stop working, the present invention avoids an influence of the common-mode transients on the output signal.

DETAILED DESCRIPTION OF EMBODIMENTS

The present invention provides a common-mode transient immunity circuit and a modulation-demodulation circuit, by outputting an enable signal when common-mode transients occur, and driving the modulation circuit or the demodulation circuit to stop working, an influence of the common-mode transients on the output signal is avoided.

A plurality of specific embodiments of the present invention are applied to facilitating a more detailed description on the technical idea, the technical problems to be solved, the technical solutions comprising the technical features, and the technical effects achieved by the present invention. It should be noted that the explanation of these embodiments does not constitute a limitation on the protection scope of the present invention. In addition, the technical features involved in the embodiments described below can be combined with each other as long as there is no conflict between each other.

In order to facilitate understanding of the embodiments of the present invention, a plurality of related elements involved in the embodiments of the present invention are introduced first herein.

In the prior art, for a gate driver adopting a capacitive isolation technology, when there is a CMTI influence, there will be a large transient voltage difference between a ground of a transmitting circuit and a ground of a receiving circuit, the voltage difference will charge and discharge the isolation capacitor, and may cause a wrong signal to be sampled mistakenly by a demodulation circuit, and cause a false output. Moreover, in the prior art, common-mode transients are suppressed mainly by a demodulation circuit receiving a signal, subjecting to a relatively large influence of a device mismatch or an amplitude of a transmission signal. Therefore, it is necessary to provide a new common-mode transient immunity circuit to solve the problem stated above.

Figure 1:
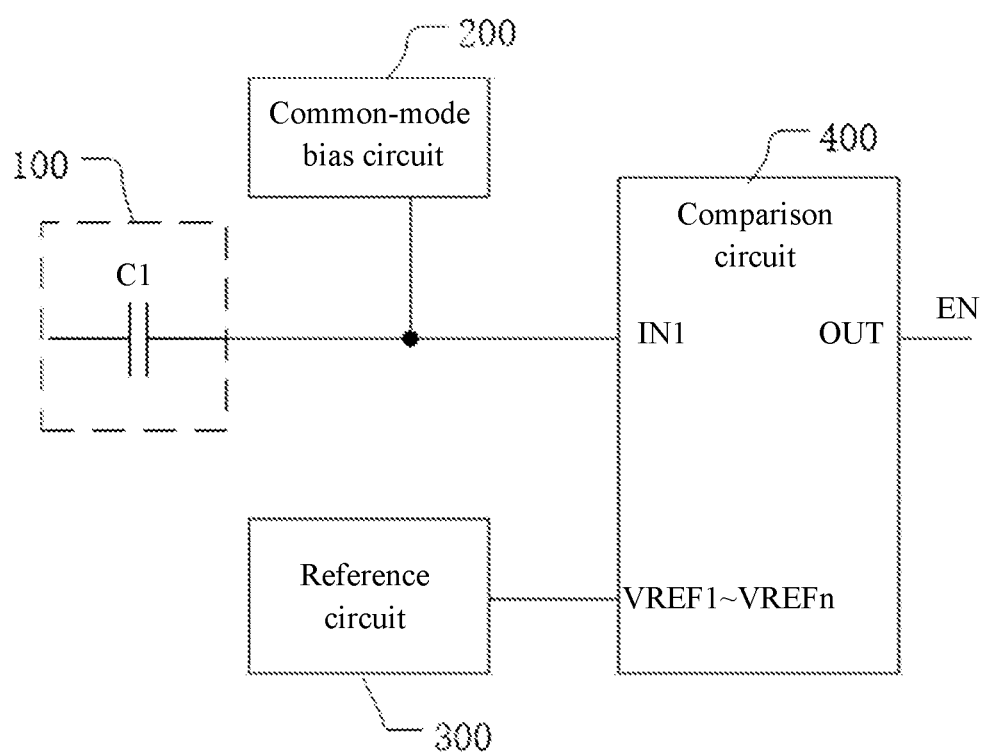
FIG. 1 illustrates a structural block diagram on an embodiment I of the common-mode transient immunity circuit provided by the present invention.
Figure 2:
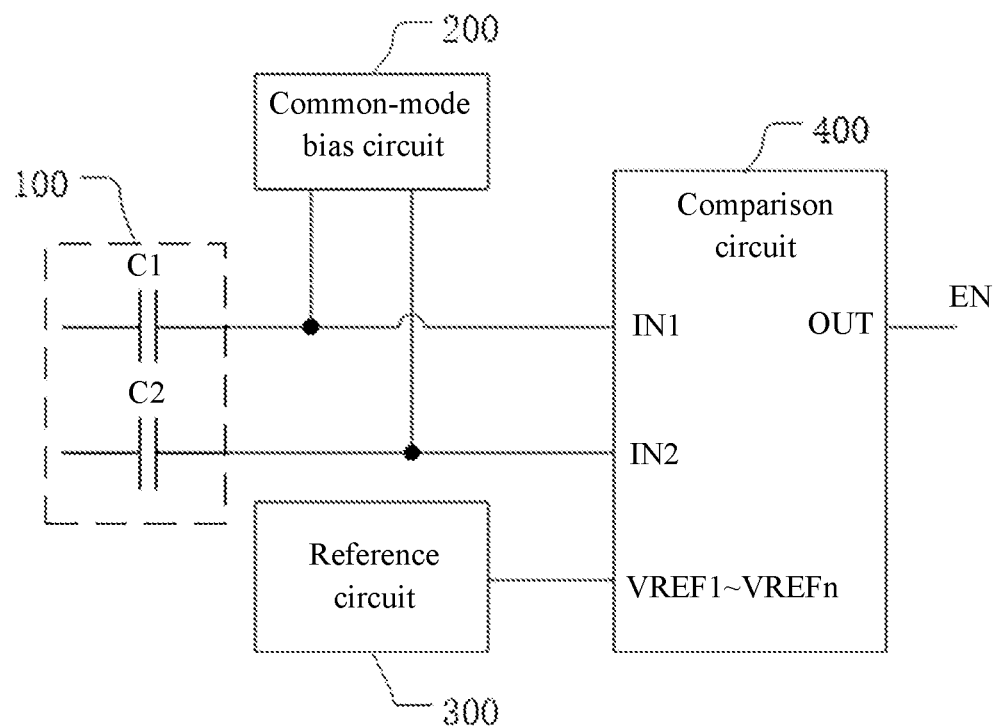
FIG. 2 illustrates a structural block diagram on an embodiment II of the common-mode transient immunity circuit provided by the present invention.

According to the problem stated above in the prior art referencing to FIG. 1 and FIG. 2, the present invention provides a common-mode transient immunity circuit, applied to connecting with a modulation circuit 10 or a demodulation circuit 20, comprising a first isolation circuit 100, a common-mode bias circuit 200, a reference circuit 300 and a comparison circuit 400; the common-mode bias circuit 200 provides a common-mode bias voltage for the first isolation circuit 100; the first isolation circuit 100 transmits the common-mode bias voltage to the comparison circuit 400; the reference circuit 300 provides a reference voltage for the comparison circuit 400; the comparison circuit 400 compares the common-mode bias voltage with the reference voltage, and when the common-mode bias voltage is greater than the reference voltage, the comparison circuit 400 outputs an enable signal to the modulation circuit 10 or the demodulation circuit 20, to drive the modulation circuit 10 to stop outputting a modulation signal or drive the demodulation circuit 20 to stop receiving the modulation signal.

In a specific implementation, the present embodiment, wherein, when the modulation circuit 10 or the demodulation circuit 20 has common-mode transients occur, it will cause a change to a voltage difference between two ends of the first isolation circuit 100, thus when the common-mode transients occur, the common-mode bias circuit 200 may provide a common-mode bias voltage, then the common-mode bias voltage is output by the first isolation circuit 100 to the comparison circuit 400. Now the comparison circuit 400 compares the reference voltage with the common-mode bias voltage, and if the common-mode bias voltage exceeds a range of the reference voltage, then outputs an enable signal EN corresponding to the modulation circuit 10 or the demodulation circuit 20, making the modulation circuit 10 stop outputting a modulation signal, or making the demodulation circuit 20 stop receiving the modulation signal, so as to prevent the demodulation circuit 20 from sampling mistakenly a wrong signal and causing a false output, when the common-mode transients occur.

Embodiment I

Specifically, referencing to FIG. 1, the first isolation circuit 100 comprises a first isolation capacitor C1, connecting with a common-mode bias circuit and the comparison circuit 400, applied to transmitting a first common-mode bias voltage IN1 output by the common-mode bias circuit 200 to the comparison circuit 400 when common-mode transients occur.

In particular, in the present embodiment, when common-mode transients occur, two ends of the first isolation capacitor C1 generate a voltage difference, and the common-mode bias circuit 200 provides a common-mode bias voltage, and the common-mode bias voltage is transmitted to the comparison circuit 400 by the first isolation capacitor C1.

Figure 3:
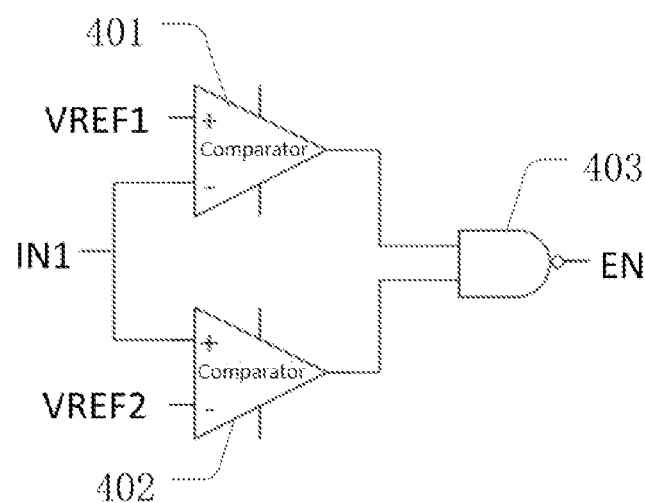
FIG. 3 illustrates a structural block diagram on the embodiment I of the comparison circuit provided by the present invention.

Further, referencing to FIG. 3, the comparison circuit 400 comprises a first comparison unit 410, connecting with the first isolation circuit 100 and the modulation circuit 10 or the demodulation circuit 20, applied to comparing the first common-mode bias voltage IN1 with the reference voltage.

In the present embodiment, the reference circuit 300 provides a reference voltage for the first comparison unit 410 in real time, and after the first comparison unit 410 receives the first common-mode bias voltage IN1, the first comparison unit 410 compares the first common-mode bias voltage IN1 with the reference voltage, and outputs an enable signal EN to the modulation circuit 10 or the demodulation circuit 20, to drive and control the modulation circuit 10 or the demodulation circuit 20.

Further, continue referencing to FIG. 3, the first comparison unit 410 comprises a first comparator 401, a second comparator 402 and a first NAND gate 403, a positive input end of the first comparator 401 is fed with a first reference voltage VREF1 output from the reference circuit; both an inverting input end of the first comparator 401 and a positive input end of the second comparator 402 are fed with the common-mode bias voltage; an inverting input end of the second comparator 402 is fed with a second reference voltage VREF2 output by the reference circuit; an output end of the first comparator 401 and an output end of the second comparator 402 connect respectively with a first input end and a second input end of the first NAND gate 403; an output end of the first NAND gate 403 connects to a modulation circuit 10 or a demodulation circuit 20.

Specifically, the reference circuit provides a corresponding number of the reference voltages to the first comparison circuit 400 according to a requirement. In the present embodiment, the reference circuit provides the first reference voltage VREF1 and the second reference voltage VREF2 to the positive input end of the first comparator 401 and the inverting input end of the second comparator 402 respectively. In a normal state, the inverting input end of the first comparator 401 and the positive input end of the second comparator 402 are receiving a normal voltage (that is, a normal voltage difference generated when a modulation-demodulation circuit is working normally). A relationship between the normal voltage, the first reference voltage VREF1 and the second reference voltage VREF2 is: the first reference voltage VREF1>the normal voltage> the second reference voltage VREF2; When common-mode transients occur, the inverting input end of the first comparator 401 and the positive input end of the second comparator 402 receive the first common-mode bias voltage IN1, and the first common-mode bias voltage IN1 is greater than the first reference voltage VREF1, and only when the first common-mode bias voltage IN1 is detected, will the comparison circuit 400 output the enable signal EN to the modulation circuit 10 or the demodulation circuit 20.

Embodiment II

Specifically, continue referencing to FIG. 2, the first isolation circuit 100 comprises a first isolation capacitor C1 connecting with the bias circuit and the comparison circuit 400, applied to transmitting a first common-mode bias voltage IN1 output by the common-mode bias circuit 200 to the comparison circuit 400 when common-mode transients occur; and a second isolation capacitor C2, connecting with the bias circuit and the comparison circuit 400, applied to transmitting a second common-mode bias voltage IN2 output by the common-mode bias circuit 200 to the comparison circuit 400 when common-mode transients occur.

In a specific implementation, in the present embodiment, it is possible to transmit the first common-mode bias voltage IN1 and the second common-mode bias voltage IN2 respectively to the comparison circuit 400 through the first isolation capacitor C1 and the second isolation capacitor C2, to provide two common-mode transient trigger signals for the comparison circuit 400.

Figure 4:
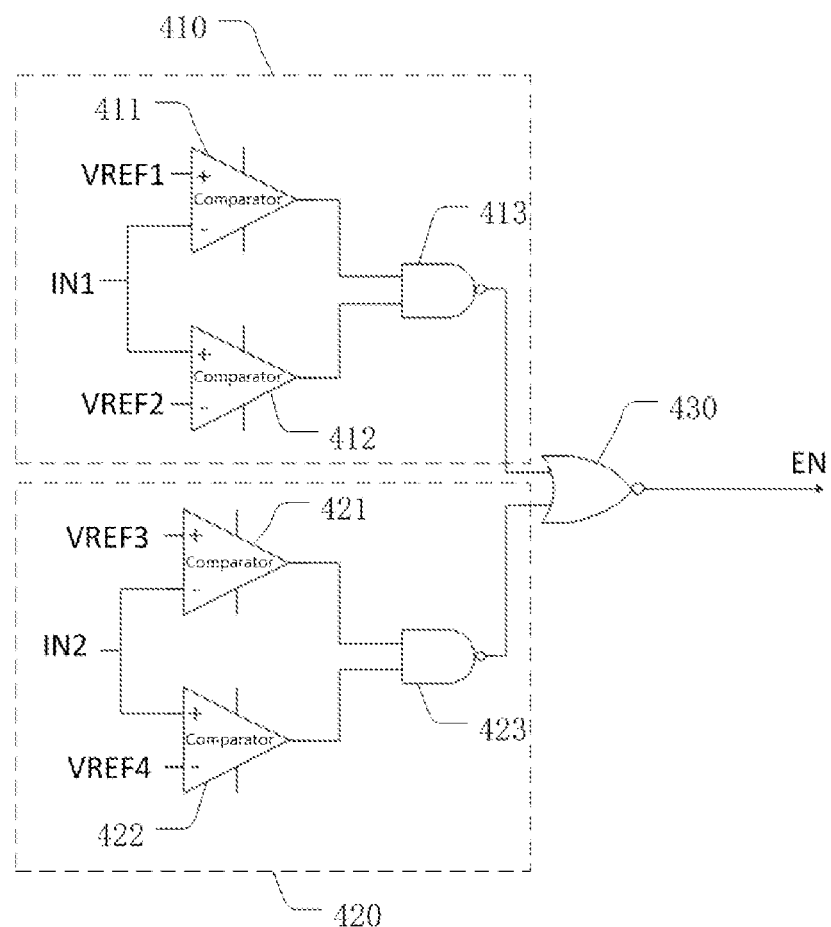
FIG. 4 illustrates a structural block diagram on the embodiment II of the comparison circuit provided by the present invention.

Further, referencing to FIG. 4, the comparison circuit 400 comprises a first comparison unit 410, connecting with the first isolation capacitor C1 and the modulation circuit 10 or the demodulation circuit 20, applied to comparing the first common-mode bias voltage IN1 with the reference voltage; a second comparison unit 420, connecting with the second isolation capacitor C2 and the modulation circuit 10 or the demodulation circuit 20, applied to comparing the second common-mode bias voltage IN2 with the reference voltage; and a first NOR gate 430, a first input end of the first NOR gate 430 connects with the first comparison unit 410, a second input end of the first NOR gate 430 connects with the second comparison unit 420, and an output end of the first NOR gate 430 connects with the modulation circuit 10 or the demodulation circuit 20.

In a specific implementation, in the present embodiment, the first comparison unit 410 and the second comparison unit 420 achieve a judgment for two paths of the common-mode transients, and the first NOR gate 430 performs a NOR calculation according to an output from the first comparison unit 410 and the second comparison unit 420, obtaining an enable signal EN to control the modulation circuit 10 stop outputting the modulation signal or control the demodulation circuit 20 stop receiving the modulation signal, further making a whole modulation-demodulation circuit stop working, and after the common-mode transients are disappeared, the enable signal EN is stopped outputting, the modulation circuit 10 or the demodulation circuit 20 is restarted, and a common-mode transient state is avoided, so that a goal of eliminating an effect of the common-mode transients is achieved.

Further, continue referencing to FIG. 2, the first comparison unit 410 comprises a first comparator 411, a second comparator 412 and a first NAND gate 413, a positive input end of the first comparator 411 is fed with a first reference voltage VREF1 output from the reference circuit, both an inverting input end of the first comparator 411 and a positive input end of the second comparator 412 are fed with the common-mode bias voltage; an inverting input end of the second comparator 412 is fed with a second reference voltage VREF2 output by the reference circuit; an output end of the first comparator 411 and an output end of the second comparator 412 connect respectively with a first input end and a second input end of the first NAND gate 413; an output end of the first NAND gate 413 connects to a first input end of a first NOR gate 430. The second comparison unit 420 comprises a third comparator 421, a fourth comparator 422, and a second NAND gate 423, a positive input end of the third comparator 421 is fed with a third reference voltage VREF3 output from the reference circuit; an inverting input end of the fourth comparator 422 is fed with a fourth reference voltage VREF4 output from the reference circuit; both an inverting input end of the third comparator 421 and a positive input end of the fourth comparator 422 are fed with the common-mode bias voltage; an output end of the third comparator 421 and an output end of the fourth comparator 422 connect respectively with a first input end and a second input end of the second NAND gate 423; an output end of the second NAND gate 423 connects to a second input end of a first NOR gate 430; an output end of the first NOR gate 430 connects with the modulation circuit 10 or the demodulation circuit 20.

In a specific implementation, in the present embodiment, the reference circuit provides a corresponding number of the reference voltages to the first comparison circuit 400 according to a requirement. Specifically, the reference circuit provides the first reference voltage VREF1, the second reference voltage VREF2, the third reference voltage VREF3, and the fourth reference voltage VREF4. In a normal state, the inverting input end of the first comparator 411 and the positive input end of the second comparator 412 are receiving a first normal voltage (that is, a normal voltage difference generated when a modulation-demodulation circuit is working normally); the inverting input end of the third comparator 421 and the positive input end of the fourth comparator 422 are receiving a second normal voltage (that is, a normal voltage difference generated when a modulation-demodulation circuit is working normally). A relationship between the first normal voltage, the first reference voltage VREF1 and the second reference voltage VREF2 is: the first reference voltage VREF1>the first normal voltage>the second reference voltage VREF2; A relationship between the second normal voltage, the third reference voltage VREF3 and the fourth reference voltage VREF4 is: the third reference voltage VREF3>the second normal voltage>the fourth reference voltage VREF4. When common-mode transients occur, the inverting input end of the first comparator 411 and the positive input end of the second comparator 412 receive the first common-mode bias voltage IN1, the inverting input end of the third comparator 421 and the positive input end of the fourth comparator 422 receive the second common-mode bias voltage IN2. The first common-mode bias voltage IN1 is greater than the first reference voltage VREF1, and only when the comparison circuit 400 detects the first common-mode bias voltage IN1 and/or the second common-mode bias voltage IN2, will the enable signal EN be output to the modulation circuit 10 or the demodulation circuit 20.

Figure 5:
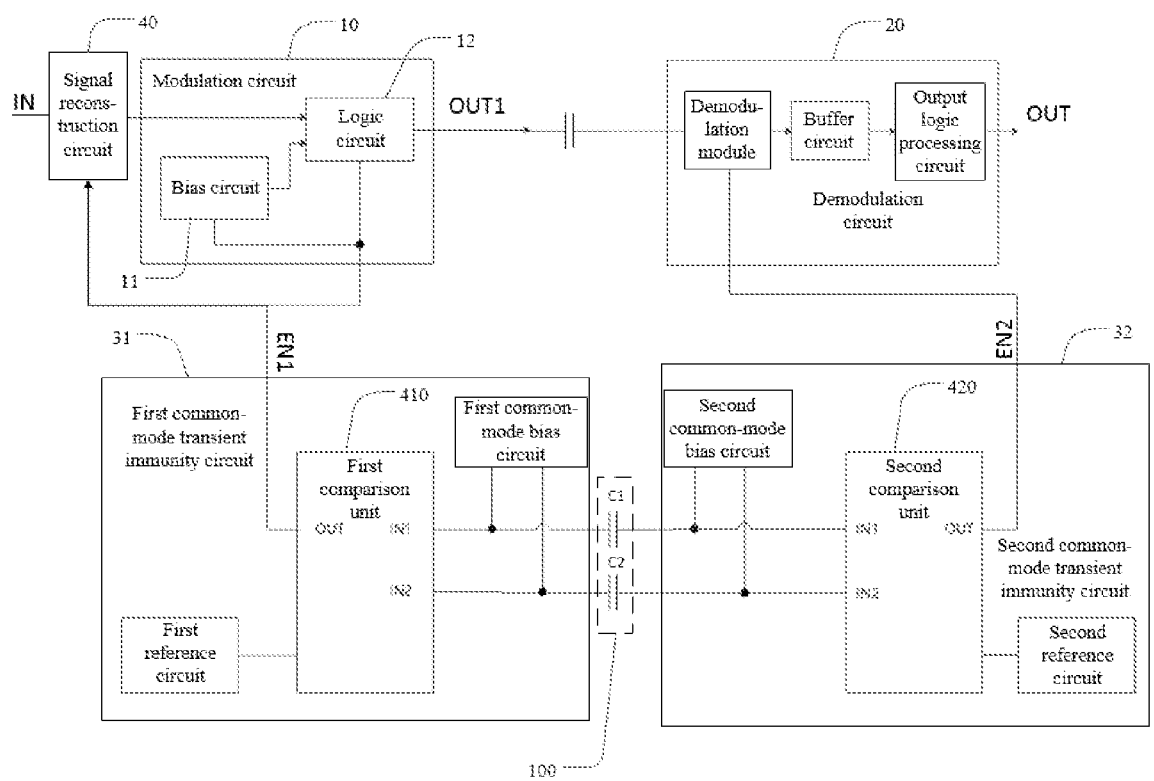
FIG. 5 illustrates a structural block diagram on the modulation-demodulation circuit provided by the present invention.

Based on the common-mode transient immunity circuit, referencing to FIG. 5, the present invention further provides a modulation-demodulation circuit, comprising: two common-mode transient immunity circuits described above, which are a first common-mode transient immunity circuit 31 and a second common-mode transient immunity circuit 32 respectively; a modulation circuit 10, connecting to the first common-mode transient immunity circuit 31, applied to stopping outputting a modulation signal when receiving the first enable signal EN output by the first common-mode transient immunity circuit 31; and a demodulation circuit 20, connecting to the second common-mode transient immunity circuit 32, applied to stopping receiving the modulation signal when receiving a second enable signal EN output by the second common-mode transient immunity circuit 32.

In a specific implementation, in the present embodiment, arranging the first common mode transient immunity circuit 31 and the second common-mode transient immunity circuit 32 in the modulation circuit 10 and the demodulation circuit 20 respectively, and detecting a common-mode transient state of each of the modulation circuit 10 and the demodulation circuit 20 at a same time, no matter common-mode transients occur in a pre-isolation stage (the modulation circuit 10) or common-mode transients occur in a post-isolation stage (the demodulation circuit 20), it is able to drive a corresponding circuit to stop working in a timely and effective manner, and restart after the common-mode transients are eliminated. That improves an accuracy and a comprehensiveness of a common-mode transients detection.

Further, referencing to the FIG. 1 and the FIG. 5 together, the modulation-demodulation circuit further comprises a signal reconstruction circuit 40. The signal reconstruction circuit stores the input signal when common-mode transients occur and suspends transmitting the input signal to the modulation circuit, and re-detects the input signal when the common-mode transients are eliminated, if the input signal has no change, then enables the modulation circuit to continue to transmit the input signal or retransmits an original input signal, and if the input signal is changed comparing with the input signal before the common-mode transients are sent, then enables the modulation circuit to transmit a new input signal.

In a specific implementation, in the present embodiment, the signal reconstruction circuit 40 connects respectively with the comparison circuit 400 and the modulation circuit. When common-mode transients occur, causing the comparison circuit 400 to control the modulation circuit 10 stop outputting the modulated signal, the signal reconstruction circuit 40 stores an input signal, and after the common-mode transients are released, the comparison circuit 400 drives the signal reconstruction circuit 40 to start, the signal reconstruction circuit 40 retransmits the input signal, and the comparison circuit 400 starts an output of the modulation circuit simultaneously, then the signal reconstruction circuit 40 continues to transmit the input signal to the modulation circuit 10, so as to achieve a signal continuity. It should be noted that the signal reconstruction circuit 40 may also be arranged in the modulation circuit, being able to be designed specifically according to a need, which is not limited herein.

Further, the modulation circuit 10 comprises a bias circuit 11 and a logic circuit 12, the bias circuit 11 and the logic circuit 12 stop working after receiving the first enable signal EN.

Specifically, when the common-mode transients occur, it is possible to stop outputting the modulation signal by turning off the bias circuit 11 and the logic circuit 12, and restart the bias circuit 11 and the logic circuit after the common-mode transients are eliminated, so as to achieve a modulation to the input signal. The logic circuit 12 is applied to performing a logic processing on a plurality of signals including a carrier wave signal, the input signal, and the enable signal EN.

All above, the present invention provides a common-mode transient immunity circuit, applied to connecting with a modulation circuit or a demodulation circuit, comprising a first isolation circuit, a common-mode bias circuit, a reference circuit and a comparison circuit; the common-mode bias circuit provides a common-mode bias voltage for the first isolation circuit; the first isolation circuit transmits the common-mode bias voltage to the comparison circuit; the reference circuit provides a reference voltage for the comparison circuit; the comparison circuit compares the common-mode bias voltage with the reference voltage, and when the common-mode bias voltage is greater than the reference voltage, the comparison circuit outputs an enable signal to the modulation circuit or the demodulation circuit, to drive the modulation circuit to stop outputting a modulation signal or drive the demodulation circuit to stop receiving the modulation signal. By outputting the enable signal when the common-mode transients occur, and driving the modulation circuit or the demodulation circuit to stop working, the present invention avoids an influence of the common-mode transients on the output signal.

It should be understood that, the application of the present application is not limited to the above examples listed. Ordinary technical personnel in this field can improve or change the applications according to the above descriptions, all of these improvements and transforms should belong to the scope of protection in the appended claims of the present application.

What is claimed is:

1. A common-mode transient immunity circuit, wherein applied to connecting with a modulation circuit or a demodulation circuit, comprising a first isolation circuit, a common-mode bias circuit, a reference circuit and a comparison circuit; the common-mode bias circuit provides a common-mode bias voltage for the first isolation circuit; the first isolation circuit transmits the common-mode bias voltage to the comparison circuit; the reference circuit provides a reference voltage for the comparison circuit; the comparison circuit compares the common-mode bias voltage with the reference voltage, and when the common-mode bias voltage is greater than the reference voltage, the comparison circuit outputs an enable signal to the modulation circuit or the demodulation circuit, to drive the modulation circuit to stop outputting a modulation signal or drive the demodulation circuit to stop receiving the modulation signal.

2. The common-mode transient immunity circuit according to claim 1, wherein the first isolation circuit comprises a first isolation capacitor, connecting with the common-mode bias circuit and the comparison circuit, applied to transmitting a first common-mode bias voltage output by the common-mode bias circuit to the comparison circuit when common-mode transients occur.

3. The common-mode transient immunity circuit according to claim 2, wherein the comparison circuit comprises a first comparison unit, connecting with the first isolation circuit and the modulation circuit or the demodulation circuit, applied to comparing the first common-mode bias voltage with the reference voltage.

4. The common-mode transient immunity circuit according to claim 3, wherein the first comparison unit comprises a first comparator, a second comparator and a first NAND gate, a positive input end of the first comparator is fed with a first reference voltage output from the reference circuit; both an inverting input end of the first comparator and a positive input end of the second comparator are fed with the common-mode bias voltage; an inverting input end of the second comparator is fed with a second reference voltage output by the reference circuit; an output end of the first comparator and an output end of the second comparator connect respectively with a first input end and a second input end of the first NAND gate; an output end of the first NAND gate connects to a modulation circuit or a demodulation circuit.

5. The common-mode transient immunity circuit according to claim 1, wherein the first isolation circuit comprises:
 a first isolation capacitor connecting with the common-mode bias circuit and the comparison circuit, applied to transmitting a first common-mode bias voltage output by the common-mode bias circuit to the comparison circuit when the common-mode transients occur; and
 a second isolation capacitor connecting with the common-mode bias circuit and the comparison circuit, applied to transmitting a second common-mode bias voltage output by the common-mode bias circuit to the comparison circuit when the common-mode transients occur.

6. The common-mode transient immunity circuit according to claim 5, wherein comparison circuit comprises:
 a first comparison unit, connects with the first isolation capacitor and the modulation circuit or the demodulation circuit, and applied to comparing the first common-mode bias voltage with the reference voltage;
 a second comparison unit, connects with the second isolation capacitor and the modulation circuit or the demodulation circuit, and applied to comparing the second common-mode bias voltage with the reference voltage; and
 a first NOR gate, a first input end of the first NOR gate connects with the first comparison unit, a second input end of the first NOR gate connects with the second comparison unit, and an output end of the first NOR gate connects with the modulation circuit or the demodulation circuit.

7. The common-mode transient immunity circuit according to claim 6, wherein the first comparison unit comprises a first comparator, a second comparator and a first NAND gate, a positive input end of the first comparator is fed with a first reference voltage output from the reference circuit; both an inverting input end of the first comparator and a positive input end of the second comparator are fed with the common-mode bias voltage; an inverting input end of the second comparator is fed with a second reference voltage output by the reference circuit; an output end of the first comparator and an output end of the second comparator connect respectively with a first input end and a second input end of the first NAND gate; an output end of the first NAND gate connects to a first input end of a first NOR gate;

the second comparison unit comprises a third comparator, a fourth comparator, and a second NAND gate, a positive input end of the third comparator is fed with a third reference voltage output from the reference circuit; an inverting input end of the fourth comparator is fed with a fourth reference voltage output from the reference circuit; both an inverting input end of the third comparator and a positive input end of the fourth comparator are fed with the common-mode bias voltage; an output end of the third comparator and an output end of the fourth comparator connect respectively with the first input end and the second input end of the second NAND gate; an output end of the second NAND gate connects to a second input end of a first NOR gate;

an output end of the first NOR gate connects with the modulation circuit or the demodulation circuit.

8. A modulation and demodulation circuit, comprising:

two common-mode transient immunity circuits according to claim 1, being respectively a first common-mode transient immunity circuit and a second common-mode transient immunity circuit; and a modulation circuit, connecting with the first common-mode transient immunity circuit, and applied to stopping outputting a modulation signal when receiving a first enable signal output by the first common-mode transient immunity circuit; and a demodulation circuit, connecting with the second common-mode transient immunity circuit, and applied to stopping receiving the modulation signal when receiving a second enable signal output by the second common-mode transient immunity circuit.

9. The modulation and demodulation circuit according to claim 8, wherein further comprising a signal reconstruction circuit, the signal reconstruction circuit stores the input signal when common-mode transients occur and suspends transmitting the input signal to the modulation circuit, and re-detects the input signal when the common-mode transients are eliminated, if the input signal has no change, then enables the modulation circuit to continue to transmit the input signal or retransmits an original input signal, and if the input signal is changed comparing with the input signal before the common-mode transients are sent, then enables the modulation circuit to transmit a new input signal.

10. The modulation and demodulation circuit according to claim 9, wherein the modulation circuit comprises a bias circuit and a logic circuit, the bias circuit and the logic circuit stop working after receiving the first enable signal; the signal reconstruction circuit suspends transmitting the input signal to the logic circuit after receiving the first enable signal, and after the first enable signal disappears, the signal reconstruction circuit detects an input state and resends the input signal.

\* \* \* \* \*